United States Patent [19]

Bienstman

[11] Patent Number: 4,564,879
[45] Date of Patent: Jan. 14, 1986

[54] ELECTRONIC POWER OVERLOAD PROTECTION CIRCUIT

[75] Inventor: Luc A. Bienstman, Mechlin, Belgium

[73] Assignee: International Standard Electric Corporation, New York, N.Y.

[21] Appl. No.: 530,181

[22] Filed: Sep. 8, 1983

[30] Foreign Application Priority Data

Sep. 20, 1982 [BE] Belgium ............................. 894437
Aug. 25, 1983 [EP] European Pat. Off. ......... 83201226.4

[51] Int. Cl.$^4$ .................................................. H02H 7/20
[52] U.S. Cl. ........................................ 361/98; 361/88; 361/101; 361/79; 330/207 P
[58] Field of Search ..................... 361/88, 89, 98, 101, 361/91, 79; 330/207 P, 298

[56] References Cited

U.S. PATENT DOCUMENTS

3,835,412  9/1974  Honda et al. ...................... 361/88 X
3,946,280  3/1976  Quist .................................... 361/88
4,375,074  2/1983  Glogolja .............................. 361/91

Primary Examiner—Patrick R. Salce
Attorney, Agent, or Firm—John T. O'Halloran; Peter R. Ruzek

[57] ABSTRACT

A protection circuit for a push-pull amplifier includes two sensing transistors arranged in respective feedback circuits. The output signals of such sensing transistors, which are indicative of the output voltage, are used to limit the output current of the amplifier in such a manner that the output current is limited to a first threshold decreasing with a steeper slope as a function of the output voltage of the amplifier between predetermined two output voltage values, and a second threshold decreasing with increasing output voltage at a lesser slope above the higher one of the two predetermined output voltage values. This characteristic response can be overridden by appropriate circuitry so long as the temperature of the amplifier is below a predetermined maximum value, so as to make the output current threshold independent of the output voltage.

16 Claims, 5 Drawing Figures

ELECTRONIC POWER OVERLOAD PROTECTION CIRCUIT

BACKGROUND OF THE INVENTION

The invention relates to an electronic power overload protection circuit adapted to limit the output power of a signal amplifier with the help of a sensing element which forms a part of a feedback circuit for said amplifier and which becomes conductive when a predetermined maximum output power threshold has been reached.

Such a protection circuit for push-pull amplifier output transistors is known from the published European patent application 0058005 in which the sensing element is a transistor so associated to the output transistor that the square of its collector current is a linear function of the output transistor collector current and of the product of the latter and the collector-emitter voltage of the output transistor. The protection operation start level can be selected by modifying the parameters of the sensing and other associated transistors and resistors but the protection circuit is always active and thus continuously consumes power.

SUMMARY OF THE INVENTION

A general object of the invention is to provide a power overload circuit for such output transistors in which the power threshold is variable.

In accordance with a first characteristic of the invention, the power threshold corresponds to a decreasing amplifier output current with a substantially linear slope up to a predetermined output voltage value and with a substantially linear lesser slope above such value.

It is to be noted that flat and linearly sloping power thresholds starting from zero output voltage are already known from the British Pat. No. 1 236 449. With the help of ordinary diodes performing a decoupling action respectively for positive and negative voltage swings across the load, this is followed either by a flat current threshold or one with a lower decreasing linear slope. Moreover, the control signal is not a linear function of the power in the output transistor, since when it does not merely depend on the output transistor current, it is additionally a function of the load voltage of the push-pull amplifier and not of the output transistor voltage.

In accordance with a second characteristic of the invention, threshold selection means are provided so that the power threshold may be selected to correspond to a constant amplifier output current.

In this manner, the threshold can follow a constant amplifier output current limit up to a certain predetermined amplifier output voltage and only thereafter will additional protection circuit means enter into action to cause the limit to decrease in function of the output voltage current with a constant linear slope, the magnitude of which is decreased in a discontinuous manner when yet a higher predetermined output voltage has been reached.

But alternatively, it is also possible to keep the constant current limit for all values of output voltage as long as the amplifier temperature does not exceed a predetermined limit. Only if the temperature becomes excessive, can the discontinuous linear slope threshold become effective, even at the lowest end of the output voltage scale. Thus, this approximation of a maximum predetermined output power threshold is then used over the whole output range but only for a higher range of temperature.

Accordingly, it becomes possible to save power by effectively disconnecting two potentiometers included in protection circuit and fed by a voltage and by a current which are each related to the respective amplifier output voltage and current. For instance, as long as the temperature is below the predetermined limit, the sensing element is merely associated with a voltage over part of the first potentiometer and which is proportional to the amplifier output current. Thus, it may be arranged to react only upon the predetermined constant current threshold being reached, whatever the value of the output voltage. However, when both potentiometers are effective in the higher temperature range, the sensing element branched between their tapping points will now react when a threshold output current is reached which is no longer a constant but decreases as the output voltage increases, and this with a broken linear slop which exhibits a discontinuity at a predetermined output voltage value.

This is obtained by a two-terminal element forming a part of the second potentiometer and having a Zener diode characteristic so that current flows therethrough only upon this value being exceeded, a suitable choice of the resistive values of the two potentiometers ensuring a lower slope from then on.

It is to be noted that U.S. Pat. No. 4,355,341 published on Oct. 19, 1982 discloses a circuit which protects an output transistor against power overload using a reference current source and it is remarked that the reference current may be a function of temperature so that the maximum output power dissipation may be made to decrease with increasing temperature. Alternatively, it is said in this reference that the current could be sharply reduced upon reaching a predetermined temperature, thereby providing thermal shutdown of the amplifier. Thus, the complete protection circuit would always be active and it is only the characteristic itself which would be modified as a function of temperature.

BRIEF DESCRIPTION OF THE DRAWING

The above mentioned and other objects and features of the invention will become more apparent and the invention itself will be best understood by referring to the following description of embodiments taken in conjunction with the accompanying drawings which represent.

DETAILED DESCRIPTION OF THE PREFERRED EMBODIMENTS

Figure 1:
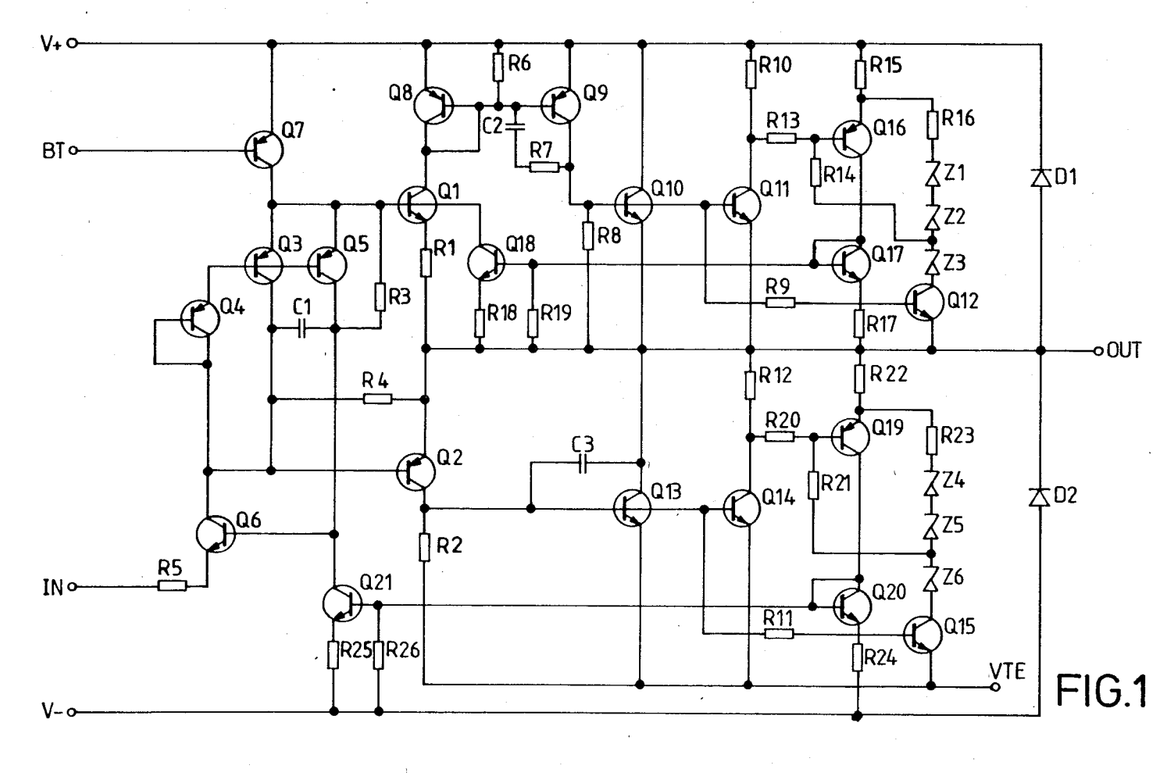
FIG. 1, a circuit diagram of an electronic push-pull amplifier protection circuit according to a first embodiment of the invention.

Referring to FIG. 1, the amplifier shown therein is used as the output stage of an operational amplifier including also an input stage and an intermediate stage which are not represented as they are similar or identical to those of the operational amplifier described in the European patent application published under No 0078347 (J. DANNEELS 7-1). As in the latter, the operational amplifier of which the present amplifier forms a part may be used in a telephone line circuit. It operates with voltages V+ =0 Volts or ground, V− = −48 Volts while VTE has a value between V+ and V− and is function of the line length. The present amplifier has an input terminal IN, an output terminal OUT and a bias terminal BT corresponding respectively to point 26, terminal OUT and the base of transistor Q27 in FIG. 1 of the above patent application. The output terminal OUT is connected to a first terminal of a two terminal load (not shown), e.g. a telephone line, the other terminal of which is connected to the output terminal of a similar amplifier. The amplifier includes transistors Q1 to Q21, resistors R1 to R26, capacitors C1 to C3, diodes D1 and D2 and Zener diodes Z1 to Z6. Transistors Q3, Q5, Q7, Q9, Q12, Q15; Q2; Q11, Q14 and Q10, Q13 have an emitter surface which is equal to about 2, 4, 5 and 30 times the emitter surface of the other transistors respectively.

The amplifier includes a class B pushpull amplifier circuit of which NPN transistor Q1 and NPN transistor Q2 form the input transistors. The emitter of Q1 is connected to terminal OUT via emitter resistor R1 and that of Q2 directly. Their collectors are coupled to V+ via a collector impedance constituted by a current source active load Q8, Q9 and to VTE via collector resistor R2 respectively. Their bases are interconnected via a crossover distortion reducing series connected pair of diodes constituted by the emitter-base junctions of PNP transistors Q3 and Q4, Q4 which are diode connected and in current mirror configuration with PNP transistors Q3 and Q5. More particularly, the collector of Q4 is connected to its base and to the collector of Q3 and its emitter is connected to the bases of Q3 and Q5. The emitter and collector of Q5 are connected to the bases of Q1 and of NPN transistor Q6 respectively. The collector of Q5 is also connected to the base of Q1 via start-up resistor R3 and via compensating capacitor C1, provided for stability reasons, to the collector of Q3. The latter is also connected to the emitter of Q2 through resistor R4 which shunts the base-emitter junction of Q2. Resistor R4 is provided in order to somewhat reduce the sum of the base-emitter voltages of the transistors Q1 and Q2 which is generally somewhat larger than that of the transistors Q3 and Q4. The collector of transistor Q6 is connected to the junction point of the collectors of Q3, Q4 and to the base of Q2, and its emitter is connected to input terminal IN via resistor R5. This input terminal may be connected to the drive transistor of the intermediate stage (not shown) of the operational amplifier. The base of transistor Q1 is connected to the collector of PNP transistor Q7 whose emitter is connected to V+ and whose base is connected to bias terminal BT. Transistor Q7 forms a part of a bias current source (not shown) included in the last mentioned intermediate stage of the operational amplifier.

It is to be noted that the above described circuit including transistors Q1 to Q4, Q6 and Q7 is substantially known, e.g. from the above mentioned European patent application and from the book "Analysis and design of analog integrated circuits" by P. R. Gray and R. G. Meyer, John Wiley and Sons, 1977, p. 337 and "Analog integrated circuit design" by A. B. Grebene, Van Nostrand Reinhold Company, 1972, p. 165.

Because transistors Q3 and Q5 are connected in current mirror configuration with transistor Q4 which delivers equal base currents to Q3 and Q5, the constant current provided by the current source transistor Q7 is equally divided between Q3 and Q5. These transistors have equal emitter currents and equal collector currents when neglecting the base currents of transistors Q1 and Q2. This means that the collector and base currents of transistor Q6 are equal so that this transistor is fully saturated. As a consequence the input IN of the amplifier is in fact connected to the base of transistor Q2 via resistor R5 only.

The collector of transistor Q1 is connected to V+ via a current source active load as already mentioned. This load comprises diode connected PNP transistor Q8 which is connected in current mirror configuration with PNP transistor Q9. More particularly, the collector of Q1 is connected to the collector of Q8 and to the bases of Q8 and Q9 the emitters of which are both directly connected to V+. The bases of Q8 and Q9 are further connected to V+ via leakage resistor R6 and to the collector of Q9 via a compensating filter circuit comprising capacitor C2 and resistor R7 in series. The collector of Q9 is connected to terminal OUT via collector resistor R8. Leakage resistor R6 prevents the operation of Q8, Q9 by leakage current of Q1 as this leakage current must be equal to VBE divided by R6 before Q8 and Q9 can operate. The collector of Q9 is also directly connected to the bases of NPN power transistor Q10 and NPN transistor Q11 and further connected to the base of NPN transistor Q12 via resistor R9. The emitters of Q10, Q11 and Q12 are all directly connected to terminal OUT and the collectors of Q10 and Q11 are connected to V+ directly and via resistor R10 respectively. As the collector current of power transistor Q10 is about six times that of Q11 and fifteen times that of Q12, transistor Q10 is the effective output transistor of the amplifier.

The collector of Q2 which is connected to VTE via collector resistor R2 as previously noted, is also directly connected to the bases of NPN power transistor Q13 and NPN transistor Q14. Via resistor R11, it is connected to the base of NPN transistor Q15. The emitters of Q13, Q14 and Q15 are all directly connected to VTE and the collectors of Q13 and Q14 are connected to terminal OUT directly and via resistor R12 respectively. As the collector current of power transistor Q13 is about six times that of Q14 and fifteen times that of Q15, this transistor Q13 is the other main output transistor of the amplifier. PNP transistor Q2 and NPN transistor Q13 form a composite transistor which is known from pp. 133-136 of the above mentioned book by A. B. Grebene. This composite transistor still behaves as a PNP transistor and has a current amplification factor beta which is the product of the betas of the two transistors. To prevent oscillations, a capacitor C3 is connected between the collector of Q13 and the joined collector of Q2 and bases of Q13 and Q14.

The purpose of the above active load Q8/Q9 is to provide a suitable collector impedance for Q1 and to generate at the emitter of transistor Q10, which is connected to terminal OUT, a signal which varies in the same sense as that at the emitter of Q1 which is connected to terminal OUT. No such active load has to be connected to the collector of transistor Q2. Indeed, by the direct connection of the collector of Q2 and the base of Q13, the signal at the collector of Q13, which is connected to terminal OUT, varies in the same sense as that at the collector of Q2 which is also connected to terminal OUT.

Because the collectors of transistors Q1 and Q2 are coupled to the bases of transistors Q10, Q11, Q12 and Q13, Q14, Q15, respectively, only a small base current of Q1 and Q2 is required to drive Q10, Q11, Q12 and Q13, Q14, Q15.

Returning to transistor Q11, its collector is coupled via resistor R13 to the base of PNP transistor Q16 and from there to terminal OUT via a voltage threshold circuit comprising resistor R14, Zener diode Z3 and transistor Q12 in series. The emitter of Q16 is connected to V+ via resistor R15 and to terminal OUT via another voltage threshold circuit comprising the series connection of resistor R16, Zener diodes Z1 and Z2, Zener diode Z3 and transistor Q12 already mentioned. The values of potentiometer resistors R14 and R16 are substantially larger than those of R13 and R15 and in turn, this is true for the latter with respect to that of R10. The collector of Q16 is connected to the collector of the diode connected NPN transistor Q17 which is connected in current mirror configuration with NPN transistor Q18. More particularly, the collector of Q16 is connected to the collector of Q17 and to the interconnected bases of Q17 and Q18, the emitters of which are connected to terminal OUT via resistors R17 and R18 respectively. The interconnected bases of Q17 and Q18 are also connected to terminal OUT via leakage resistor R19 which prevents the operation of Q17, Q18 by leakage current of Q16 in a similar way as R6, the collector of Q18 being connected to the base of transistor Q1. Terminal OUT is also connected to V+ via overload protection diode D1.

Likewise, the collector of transistor Q14 is connected, via resistor R20, to the base of PNP transistor Q19 and from there to VTE via a voltage threshold circuit comprising resistor R21, Zener diode Z6 and Q15 in series. The emitter of Q19 is connected to output terminal OUT via resistor R22 and to VTE via a voltage threshold circuit comprising resistor R23, Zener diodes Z4 and Z5, Zener diode Z6 and Q15 already mentioned in series. The collector of Q19 is connected to the collector of the diode connected NPN transistor Q20 which is connected in current mirror configuration with NPN transistor Q21. More particularly, the collector of Q19 is connected to the collector of Q20 and the interconnected bases of Q20 and Q21, the emitters of which are connected to V− via resistors R24 and R25 respectively. The interconnected bases of Q20 and Q21 are also connected to V− via leakage resistor R26 similar to R19 and the collector of Q21 is connected to the base of transistor Q6. Voltage V− is also connected to terminal OUT via protection diode D2 which has the same function as D1.

In the above described amplifier circuit transistors Q1 to Q4, Q7 to Q11, Q13 and Q14 form part of the amplifier proper, whilst the other transistors Q5, Q6, Q12 and Q15 to Q21 form part of a current/power overload protection arrangement for this amplifier and more particularly for the power transistors thereof. This protection arrangement more particularly comprises a first protection circuit Q12, Q16, Q17, Q18 associated to part Q1, Q8–Q11 of the amplifier and a second protection circuit Q15, Q19–21, Q6, Q5 associated to part Q2, Q13, Q14 of this amplifier. Each protection circuit includes a detection circuit made up mainly of transistors Q16, Q12 and Q19, Q15 respectively, and a feedback circuit made up mainly of transistors Q17, Q18 and Q20, Q21, Q6 respectively. Each detection circuit includes two voltage threshold circuits R14, Z3, Q12; R21, Z6, Q15 and R16, Z1–Z3, Q12; R23, Z4–Z6, Q15 respectively.

When transistor Q1 is not conductive, this is true also for Q11 and Q12 so that the associated protection circuit is disabled. Similarly this obtains for transistor Q2 in relation to transistors Q14 and Q15.

When an input signal is applied to input IN, for instance transistor Q1 associated with the first protection circuit becomes conductive, its collector current being mirrored by transistors Q8 and Q9 in the bias resistor R8 of transistors Q10 and Q11. When the bias voltage thus developed in R8 exceeds the $V_{BE}$ of Q10 and Q11 the latter become conductive. For instance, the R8=700 ohms this already happens for a collector current I of Q11 equal to about 1 mA. The resistance values have been so chosen that when this bias voltage reaches a value such that the current I is equal to about 10 mA, transistor Q12 becomes saturated in preparation for the connection of potentiometers R10/13/14 and R15/16 to terminal OUT. However, as long as the voltage V between V+ and OUT does not reach the Zener voltage $V_{Z3}$ of Z3 the current cannot flow through resistor R14 and as long as it is lower than the Zener voltage $V_Z$ of Z1, Z2 and Z3 in series, the current cannot flow through resistor R16. For such voltages lower than $V_{Z3}$, the voltage drop across the resistor R10 is used to protect transistor Q11, and therefore also transistor Q10, against current overload. When at least Zener diode Z3 is switched in, the circuit protects against power overload according to a characteristic representing an approximately constant power threshold.

This will now be explained in detail by referring also to FIG. 2 where I, the collector current of Q11, is plotted in function of V, the variable output voltage between terminals V+ and OUT. When Q11 is conductive and as long as V+ is larger than an initial voltage and smaller than the Zener voltage $V_{Z3}$ of Z3, current only flows between V+ and OUT via R10 and Q11. Sensing transistor Q16 becomes conductive when I produces a voltage drop in R10 equal to the base-emitter volrage $V_{BE}$ of Q16. This current is essentially the maximum current allowed because sensing transistor Q16 when becoming conductive will limit the current through Q11 by the feedback action to be described later. Because $V_{BE}$ is substantially a constant this is true also for the maximum allowable collector current $I_{MAX}$. Summarizing, for an output voltage V varying between an initial voltage and the Zener voltage $V_{Z3}$ of $Z_3$ the maximum allowable collector current $I_{MAX}$ of Q11 remains substantially constant as shown by AB in FIG. 2. Because the collector current of Q10 is six times that of Q11 the maximum collector current allowed for Q10 is equal to six times that of Q11 and is for instance equal to 120 mA.

When the variable output voltage V across the terminals V+ and OUT becomes larger than the Zener voltage $V_{Z3}$, then there flows between these terminals not only a collector current I but also, when neglecting the base current of Q16 and the collector-emitter voltage of Q12, an additional current $$I_1 = \frac{V - V_{Z3}}{R10 + R13 + R14} \quad (1)$$

$I_1$ being much smaller than I because R13 and R14 are much larger than R10, e.g. R10=50 ohms, R13=1.58 kilo-ohms and R14=40 kilo-ohms. The sensing transistor Q16 now becomes conductive when I has a maximum value given by $$I_{MAX1} = \frac{V_{BE}}{R10} - \left(1 + \frac{R13}{R10}\right) I_1 \qquad (2)$$

$$= I_{MAX} - \frac{R10 + R13}{R10(R10 + R13 + R14)} (V - V_{Z3})$$

$$= I_{MAX} - \frac{R13}{R10 \cdot R14} (V - V_{Z3})$$

the third expression neglecting R10 as compared to R13 and R10+R13 as compared to R14.

Figure 2:
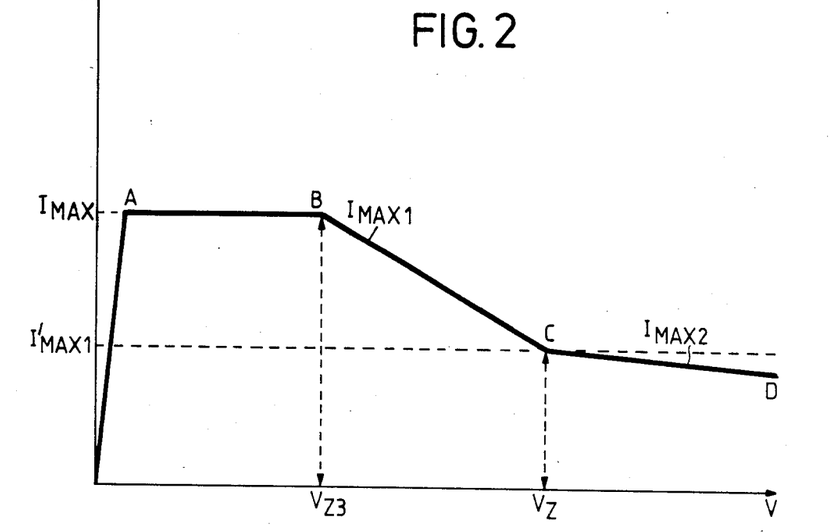
FIG. 2, a collector current versus voltage characteristic of transistors Q11/14 in FIG. 1.

Hence, when V exceeds the voltage $V_{Z3}$ the maximum allowed collector current of Q11 decreases linearly with increasing V, from a value $I_{MAX}$ and with a negative slope substantially equal to R13/R10.R14 (part BC in FIG. 2).

When the variable output voltage V reaches the Zener voltage $V_Z = V_{Z1} + V_{Z2} + V_{Z3}$, the maximum value of the collector current of Q11 becomes equal to $$I'_{MAX1} = I_{MAX} - \frac{R13}{R10 \cdot R14} (V_{Z1} + V_{Z2}) \qquad (3)$$

From that moment on another additional current $$I_2 = \frac{V - V_Z}{R15 + R16} \qquad (4)$$

starts flowing between the terminals V and OUT via R15, R16, Z1, Z2, Z3 and Q12. This current is also much smaller than I because e.g. R15=1.58 kilo-ohms and R16=48 kilo-ohms.

The sensing transistor Q16 now becomes conductive when the collector current has a maximum value represented by CD in FIG. 2 and given by $$I_{MAX2} = \frac{V_{BE}}{R10} - \left(1 + \frac{R13}{R10}\right) I_1 + \frac{R15}{R10} I_2 \qquad (5)$$

$$= I_{MAX1} + \frac{R15}{R10}\left(\frac{V - V_Z}{R15 + R16}\right)$$

$$= I'_{MAX1} + \frac{R13}{R10R14}(V_Z - V) + \frac{R15}{R10}\left(\frac{V - V_Z}{R15 + R16}\right)$$

$$= I'_{MAX1} - \frac{R13}{R10R14}\left(1 - \frac{R14R15}{R13R16}\right)(V - V_Z)$$

Apart from the additional current function of $I_2$, the first of the above four expressions for $I_{MAX2}$ is thus similar to the first expression for $I_{MAX1}$ in equation (2). The second follows by using equations (2) and (4) and the third by resorting to equation (3), the fourth and final form taking into account that R15 is small as compared to R16.

Thus, the previous negative linear slope of V given by (2) is now multiplied by the factor 1-(R14R15/R13R16) which means that when R14R15 is less than R13R16, or more precisely (R10+R13) R16 if none of the above approximations is used for the resistance values, the current I still decreases with increasing V but more slowly than before. Hence, after the flat range one obtains an approximation of a hyperbolic current versus voltage characteristic, i.e. a characteristic representing a substantially constant power.

Summarizing, when V increases, the maximum collector current allowed for Q11 remains equal to $I_{MAX}$ until V reaches the voltage $V_{Z3}$. Thereafter this current decreases linearly in such a way that the power consumption remains substantially constant, first with a first slope until V reaches $V_Z$ and thereafter with a second slope which is much smaller than the first one. In other words, the protection circuit first provides protection against a current overload corresponding to $I_{MAX}$ in Q11 and Q10 as soon as Q11 becomes conductive and afterwards against a power overload according to a substantially constant power characteristic approximated by $I_{MAX1}$ and $I_{MAX2}$ from the moment both Q12 and Z3 are conductive.

Whenever sensing transistor Q16 becomes conductive, its collector current is mirrored by the transistors Q17 and Q18 which both become conductive. The conductive transistor Q18 derives base current from Q1 so that this transistor Q1 and therefore also Q10 and Q11, through Q8 and Q9, become less conductive due to this feedback loop action.

The operation of the sensing transistor Q19 is similar to that of Q16 but its influence on PNP transistor Q2 is different because the base current of the latter cannot be limited as that of the NPN transistor Q1 fed by the constant current source provided by Q7. Thus, to avoid too high a power consumption in deviating base current from Q2 when transistors Q19, Q20 and Q21 become conductive, base current is now derived through the saturated transistor Q6, acting as a current-voltage converter, so that the latter then leaves the saturation region and decreases the input signal applied to Q2 because of its emitter-collector path being connected between R5 and the base of Q2.

Figure 3:
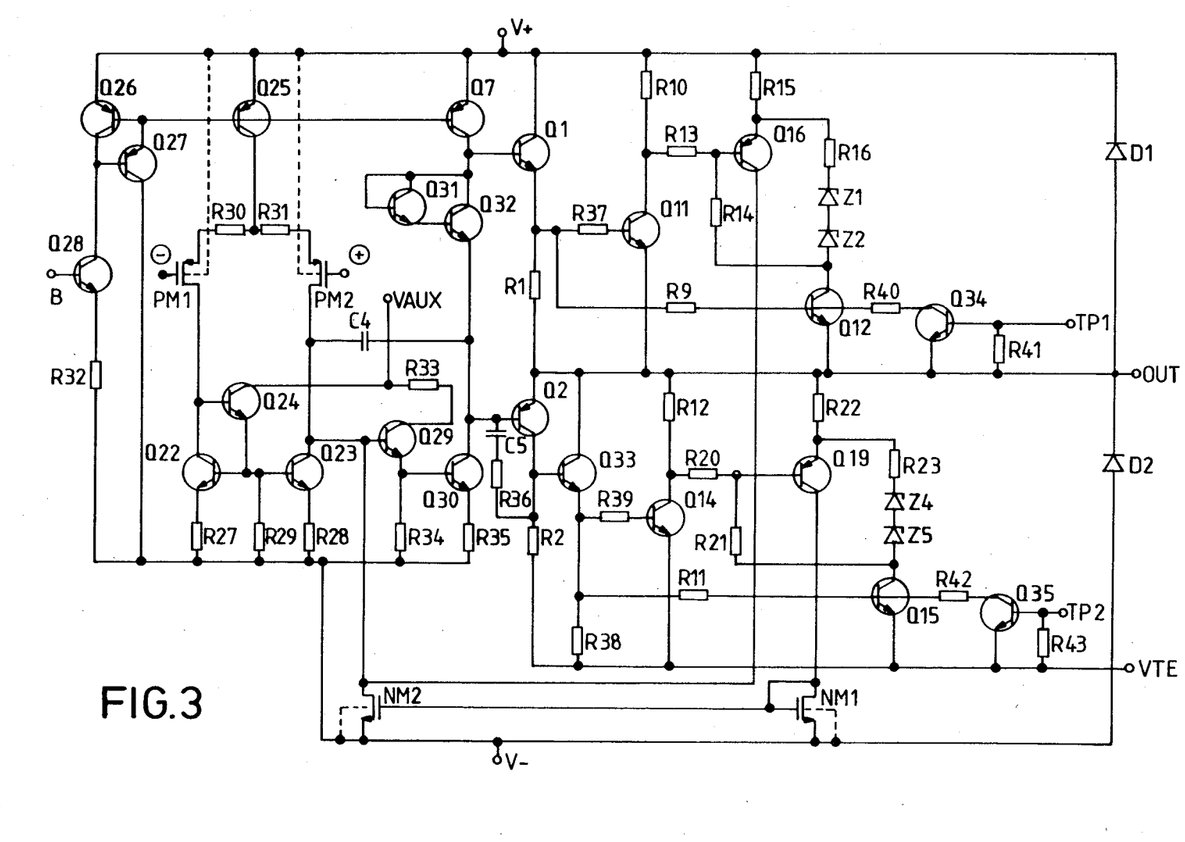
FIG. 3, a modified version of the circuit of FIG. 1 to enable temperature control.
Figure 4:
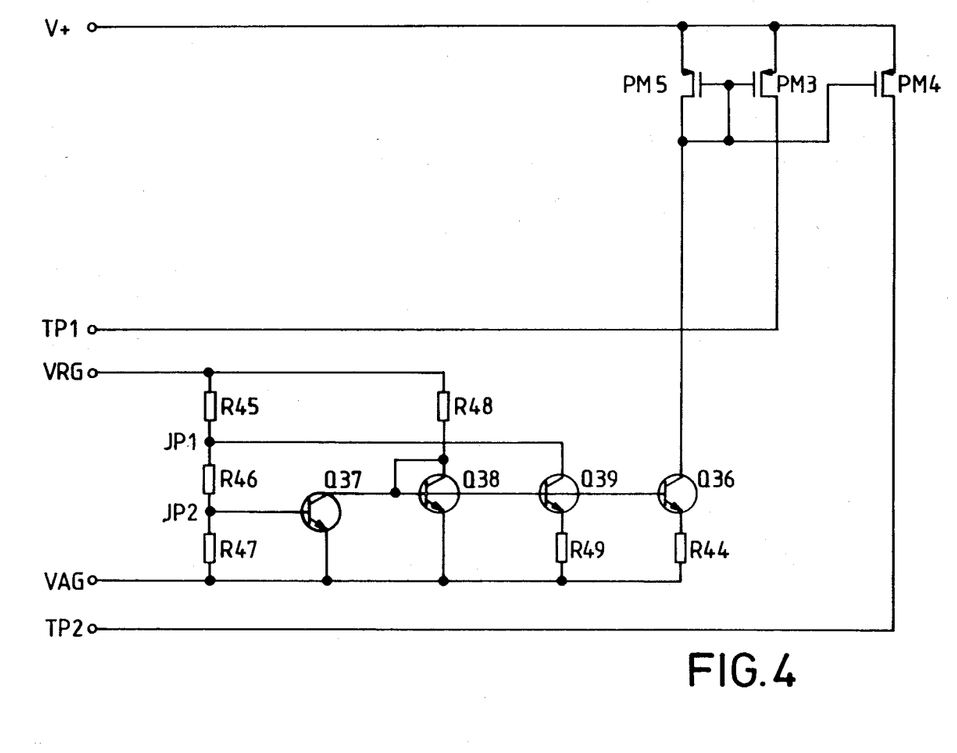
FIG. 4, a temperature sensing circuit associated with the protection circuit of FIG. 3.
Figure 5:
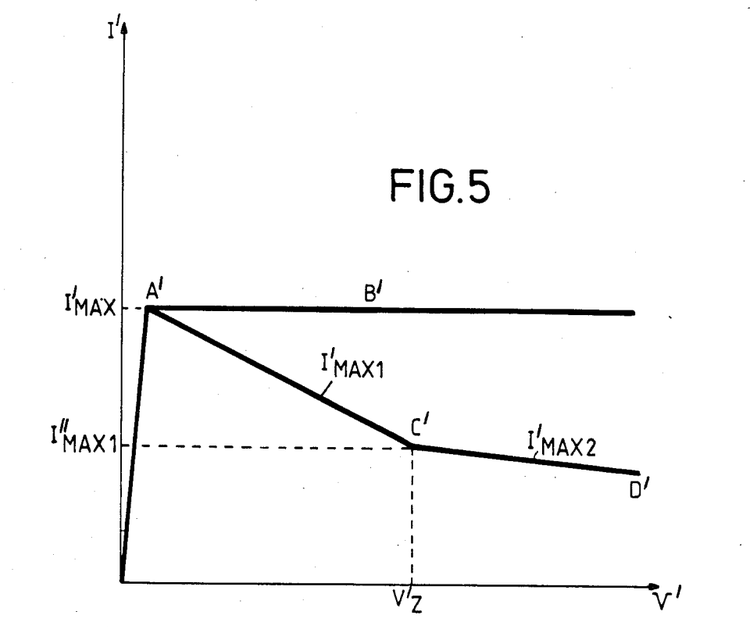
FIG. 5, a collector current versus voltage characteristic of transistors Q11/14 in FIG. 3.

Reference is now made to FIG. 3 showing a modified operational amplifier associated with the temperature sensing circuit of FIG. 4 and to FIG. 5 showing the collector current versus output voltage characteristic of transistor Q11/14. In FIG. 3 the elements having a function similar to that of FIG. 1 are indicated by the same reference numerals. The scales of FIGS. 3 and 5 are not alike.

The operational amplifier shown includes an input stage (transistors Q22-29), an intermediate stage (transistors Q7, 30) and an output stage (transistors Q1, 2, 11, 14, 31, 32, 33). The input and intermediate stages are of the type disclosed on page 337, FIG. 6.12 of the above mentioned book by P. R. Gray and R. G. Meyer.

The input stage is a differential stage with a single-ended output and includes PMOS transistors PM1 and PM2 whose gate electrodes constitute the inverting and non-inverting input terminals − and + of the amplifier respectively. The transistors PM1, and PM2 the substrates of which are connected to V+ as indicated by the dashed lines are biased by a current source comprising NPN transistors Q22, Q23, Q24 connected to V− through their respective emitter resistors R27, R28 and R29. The drain electrodes of PM1 and PM2 are connected to the collectors of Q22 and Q23 respectively whose bases are commoned to the emitter of Q24 having its base connected to the collector of Q22 and its collector to an auxiliary voltage VAUX which is 15 Volts above V−. Transistors PM1 and PM2 have a common active load constituted by PNP transistors Q25 whose emitter is connected to V+ and whose collector is connected to the source electrodes of PM1 and PM2 via resistors R30 and R31 respectively. Transistor Q25 is connected in current mirror configuration with PNP transistor Q7, the bases of Q25 and Q7 being connected to the base of PNP transistor Q26 which together with PNP transistor Q27 and NPN transistor Q28 constitute a current source of the type disclosed on page 4, FIG. 7 of the book "201 Analog IC designs, compiled tested and written by the staff of Interdesign (Ferranti), Sunnydale, Calif., 1980. In this current source the base of Q28 is connected to a bias voltage B which is such that a fixed current, e.g. of 60 mA, flows in the collector of Q28 whose emitter is connected to V− via resistor R32. The collector of Q28 is commoned with the collector of Q26 and the base of Q27 whose collector is directly connected to V− and whose emitter is connected to the base of Q26. The emitters of Q26, Q25 and Q7 are all connected to V+.

The differential input stage has a single ended output as the collector of Q23 is connected to the base of emitter follower NPN transistor Q29 whose collector is connected to VAUX through resistor R33, its emitter being biased to V− via resistor R34. Transistor Q29 constitutes a buffer between the input stage and the intermediate stage which includes current source PNP transistor Q7 and NPN transistor Q30 whose emitter is connected to V− through resistor R35 and which provides a large voltage gain. The collectors of Q7 and Q30 constitute the bias input and the signal input of the push-pull output stage, these inputs being connected to the bases of NPN transistor Q1 and PNP transistor Q2 respectively. These bases ae interconnected via the series connected base-to-emitter junctions of diode connected NPN transistors Q31 and Q32 whose collectors are commoned to that of Q7. The emitter of Q32 is coupled to the junction point of the drain electrode of PM2 and the collector of Q23 through compensating feedback capacitor C4, whilst the collector of Q2 is connected to its base via a compensating filter comprising capacitor C5 and resistor R36 in series.

In the output stage, generally similar to that of FIG. 1, the collector-to-emitter path of transistor Q1 is connected in series with resistor R1 between V+ and the output terminal OUT, and likewise the emitter-to-collector path of transistor Q2 is connected in series with resistor R2 between terminal OUT and VTE. However, the emitter of Q1 is now coupled to the base of NPN power transistor Q11 via resistor R37. Likewise, the collector of Q2 is coupled to the base of NPN power transistor Q14 through resistor R39 but also through a preceding emitter follower comprising NPN transistor Q33 with its collector and base coupled to the OUT terminal and to the collector of Q2, its emitter being biased to VTE through resistor R38. Transistors Q11 and Q14 replace transistors Q10/11 and Q13/14 of FIG. 1 respectively. Q2 and Q33 together form a compound transistor having a beta factor which is the product of the beta factors of Q2 and Q33. This compound transistor still behaves as a PNP transistor and has a relatively small cut-off frequency.

The power overload protection circuits associated to the transistors Q11 and Q14 are substantially as already shown on FIG. 1 but differ therefrom in that:
the junction points of R14 and Z2 and of R21 and Z5 are now directly connected to the collectors of Q12 and Q15 respectively, instead of through Zener diodes Z3 and Z6. As a result, and as will be explained later, the I'/V' characteristic (FIG. 5) of the transistors Q11/14 now comprises a current limiting portion A'B' extending over the whole voltage range as an alternative to a power limiting portion B'C'D' with V'$_Z$ now equal to V$_{Z1}$+V$_{Z2}$;
the feedback connection from the collectors of both sensing transistors Q16 and Q19 now extends to the base of a same transistor, i.e. buffer transistor Q29 of the input stage. For Q16 this is a direct connection, whereas the collector of sensing transistor Q19 is connected to the drain electrode of diode connected NMOS transistor NM1 whose source electrode is connected to V− and whose gate electrode is connected in current mirror fashion to that of NMOS transistor NM2, the source electrode of which is connected to the base of Q29. Both substrates of NM1 and NM2 are connected to v− as indicated by the dashed lines.

It is to be noted that the difference in the feedback connections of FIG. 3 and FIG. 1, where the outputs of the sensing transistors Q16 and Q19 go to the bases of the individual transistors Q18 and Q21 which are both included in the output, are due to the fact that in the circuit of FIG. 3 all the stages can be continuously maintained in their operative condition so that it is possible to establish a feedback connection to a common element of the input stage, i.e. Q29. In FIG. 1, only the shown output stage is continuously maintained in the active condition so that it is necessary to establish a feedback connection from Q16/19 to an element of a corresponding part of the output stage, i.e. Q18/11. Indeed, it was desirable that the input and intermediate stages be made inactive when the amplifier is in the rest condition to save power, such a measure not being required for the circuit of FIG. 3 because the amplifier shown therein is of much simpler design and therefore consumes less power.

With the above described circuit of FIG. 3, first the output current through Q11/14 is limited by the resistor R10/12, as long as transistor Q12/15 is blocked, to a maximum value I'$_{MAX}$ such that the voltage across such resistors is equal to the V$_{BE}$ of Q16/19, i.e. to a value of about 120 mA. This is represented in the I'/V' characteristic of FIG. 5 by line A'B'. When Q12/15 becomes conductive, the power protection based on the actual power and not merely the current is immediately active because of the absence of Zener diode Z3/6. However, transistor Q12/15 now only becomes conductive for a base voltage corresponding to a current through Q11/14 equal to about 10 mA, as in FIG. 1 and when simultaneously the amplifier temperature exceeds a predetermined value. Indeed, the above current/power overload protection circuits and more particularly the two transistors Q12 and Q15 thereof are now additionally coupled to a common temperature sensing circuit which prevents them from being saturated by the applied base current as long as the amplifier temperature does not exceed a predetermined value.

The base of transistor Q12 is connected between resistors R9 and R40 which are branched in series with the collector-to-emitter path of NPN transistor Q34 across R1, the base of Q34, i.e. terminal TP1, being connected to OUT through bias resistor R41. Likewise, the base of Q15 is connected between resistors R11 and R42 which are branched in series with the collector-to-emitter path of NPN transistor Q35 across R38, the base of Q35 being connected to VTE via bias resistor R43.

As shown in FIG. 4, V+ is connected to TP1 and TP2 via the source-to-drain paths of PMOS transistors PM3 and PM4 which are connected in current mirror configuration with a diode-connected PMOS transistor PM5, the source-to-collector path of which is connected between V+ and terminal VAG in series with the collector-to-emitter path of NPN transistor Q36 and resistor R44. The potential at VAG is half-way between V- and VAUX. A potentiometer comprising resistors R45, R46 and R47 in series is connected between terminals VRG and VAG. The potential between the two is temperature independent and equal to 2.4 Volts, i.e. twice the so-called transistor bandgap voltage $V_{BE}=1.2$ Volt. In this way, a temperature independent voltage of about 0.4 Volt is established at the junction point JP2 of R46 and R47 which is connected to the base of a temperature sensing NPN transistor Q37 whose collector is commoned to that of NPN transistor Q38 and therefore to the base thereof since it is diode connected and forms a part of a current source. Its collector is connected to VRG via resistor R48 and its emitter is directly connected to VAG. Its base is also connected in current mirror configuration to the bases of the above mentioned transistor Q36 and of a further transistor Q39. The emitter of Q39 is connected to VAG through resistor R49 and its collector is connected to the junction point JP1 of R45 and R46.

The temperature sensing transistor Q37 is mounted in the immediate proximity of the output transistors Q11 and Q14 so that the temperature sensed is a function of the output current I' flowing through this transistor and of course also the surroundings.

The temperature sensing circuit operates as follows.

As long as the temperature sensed by transistor Q37 does not exceed a predetermined maximum, e.g. 160° C., the output current is limited by R10 and R12. Sensing transistor Q37 then remains blocked and does not prevent the operation of current source transistor Q38 whose constant collector current is mirrored in the transistors Q39 and Q36 so that these have the same collector current. That of Q36 flows in PM5 and is again reflected in PM3 and PM4 so that the same current flows from V+ to OUT via PM3, TP1 and R41 and to VET via PM4, TP2 and R43. As a consequence Q34 and Q35 are made conductive, so that potentiometers R9, R40 and R11, R42 are connected across R1 or R38. The values of these resistors have been so chosen that the operation of Q12 and Q14 is then inhibited independently of the voltage applied to its base.

When the temperature increases, the base-to-emitter voltage $V_{BE}$ of transistor Q37 decreases and when this voltage becomes lower than 0.4 Volts, e.g. at 160° C., at the junction point JP2, transistor Q37 becomes conductive and thus short-circuits the bases of transistors Q38, Q39 and Q36 to VAG. These transistors are therefore all blocked and the same is true for PM3, PM4 and PM5 and for Q34 and Q35 so that the operation of the transistors Q12 and Q15 is no longer inhibited by the temperature control and only dependent on the current control, as in FIG. 1. Because of the absence of a Zener diode Z3/Z6, the power protection already becomes effective from point A' of the characteristic and varies as represented in dotted lines by A'C'D' in FIG. 5. In a way similar to FIG. 2, the slope changes at C', when V' is equal to V'$_Z$, this time equal to $V_{Z1}+V_{Z2}$.

From the above it follows that with the circuit of FIGS. 3, 4 and 5, either the output current or the actual output power of Q11 and Q14 is limited and that this power limitation only occurs when the output current and the temperature sensed are both above predetermined values.

In order to prevent an oscillatory condition for the temperature control circuit, a certain amount of hysteresis is provided by the circuit involving Q39. As soon as Q39 is blocked in the way described above, it no longer draws current through R45 so that the voltage at JP1 and hence at JP2 increases to a value which, for JP2, is larger than the 0.4 Volt present prior to the operation of Q37. This means that Q37 only becomes blocked again when the temperature drops to a value, e.g. 130° C., for which the $V_{BE}$ of Q37 has increased above this larger voltage value.

The operation of the protection circuits, with Q12 or Q15 conductive or not, is as follows. In case the amplifier delivers a current from V+ (source) to a load via R10, Q11 and OUT which is sufficiently high to make current sensing transistor Q16 conductive, the latter supplies an additional base current to buffer transistor Q29, this current flowing from V+ to V- via R15, Q16, the base-to-emitter junction of Q29 and resistor R34. As a consequence, Q29 becomes more conductive and the same is true for transistor Q30. The latter thus draws through Q31, Q32 a larger part of the constant current provided by Q7 so that less current is delivered to Q1 which therefore becomes less conductive. Also, the current flowing in Q11 is therefore reduced, as required. In case a current flows from a load (sink) to VTE in the amplifier via OUT, R12 and Q14, which current is sufficiently high to make current sensing transistor Q19 conductive, the latter supplies to NM1 a current which is reflected to NM2. Thus base current is now drawn to V- from buffer transistor Q29 which therefore becomes less conductive and the same is true for Q30. The latter thus draws a smaller part of the constant current provided by Q1, 31, 32 (because Q1 is off) so that Q2 becomes less conductive and the current flowing in Q14 is therefore also reduced, as required.

Another possible advantage of the embodiment of FIGS. 3 to 5 is that no measures must be provided to avoid incorrect operation due to some transient conditions. For instance, when the amplifier of FIG. 1 operating as per FIG. 2 is connected to a subset via a telephone line, without extra precautions, such a protection circuit might react to the transient condition produced upon the handset being taken off the cradle. This might unduly limit the line current to a value given by the constant power characteristic before a DC current regulating circuit associated to the amplifier would be able to establish a wanted line current different from the established one. This is avoided for the circuits of FIGS. 3 and 4 since therein the output current is initially not limited by curve A'C'D' but can extend as far as A'B' (FIG. 5).

While the principles of the invention have been described above in connection with specific apparatus, it is to be clearly understood that this description is made only by way of an example and not as a limitation on the scope of the invention.

I claim:

1. Electronic power overload protection circuit for limiting the output power of a signal amplifier, comprising means for sensing the output voltage of the amplifier; and means for limiting the output current of the amplifier in dependence on the output of said sensing means, when said output voltage is between a lower one and a higher one of two predetermined output voltage values, to a first threshold which gradually decreases substantially linearly with increasing output voltage at a first rate and, when said output voltage exceeds said higher one of said predetermined output voltage values, to a second threshold which gradually decreases substantially linearly with increasing output voltage at a second rate that is lower than said first rate.

2. The electronic power overload protection circuit as defined in claim 1, wherein said sensing means includes a sensing element having a control input that controls the current flow through said sensing element; and further comprising a first voltage divider having a first and a second part arranged in series with one another between points whose voltage difference and current are proportional to the output voltage and current of the amplifier, said control input being connected to a tap point between said first and second parts of said first voltage divider to control the current flow through said sensing means in dependence on a voltage which is proportional to the output voltage of the amplifier.

3. The electronic power overload protection circuit as defined in claim 2, wherein said sensing element has a current flow input and an output; and further comprising a second voltage divider having a first and a second part, the latter including at least one two-terminal element with a Zener diode characteristic, said current flow input of said sensing element being connected to a tap point between said first and second parts of said second voltage divider.

4. The electronic power overload protection circuit as defined in claim 3, wherein said sensing element is a sensing transistor, and wherein said contol and current flow inputs are the base and emitter terminals of said sensing transistor.

5. The electronic power overload protection circuit as defined in claim 2; further comprising a switching transistor arranged in series with said first voltage divider and having a control input for controlling the flow of current through said switching transistor; and means for supplying to said control input of said switching transistor a current that is related to the output current of the amplifier.

6. The electronic power overload protection circuit as defined in claim 5, further comprising temperature sensing means, and an additional transistor having an output which normally short-circuits the input of said switching transistor, and a control input which controls the flow of electric current through said additional transistor and is connected to the output of said temperature sensing means such that said additional transistor is prevented from becoming conductive until the temperature as sensed by said temperature sensing means has exceeded a predetermined maximum value.

7. The electronic power overload protection circuit as defined in claim 6, further comprising a diode-connected current source transistor having a base connected to said additional transistor, the output of said temperature sensing means being connected in shunt across the input circuit of said current source transistor.

8. The electronic power overload protection circuit as defined in claim 7, and further comprising a voltage divider branched across a temperature-independent direct current voltage source and having a first and a second tapping point, and a further transistor having a collector connected to said tapping point; and wherein said temperature sensing means includes a temperature sensing transistor having a collector connected to the bases of said current source transistor and of said further transistor and a base connected to said second tapping point of said voltage divider, the temperature sensing, further and current source transistors having respective emitters which are connected to one pole of said direct current source, said temperature sensing transistor becoming conductive when the temperature sensed thereby exceeds said maximum value but exhibiting hysteresis so as not to become blocked until the temperature being sensed decreases below a predetermined minimum value lower than said maximum value.

9. The electronic power overload protection circuit as defined in claim 3, wherein the ratio of the resistance value of said second part of said first voltage divider to that of said second part of said second voltage divider is smaller than the ratio of the resistance of said first part of said first voltage divider to that of said said first part of said second voltage divider.

10. The electronic power overload protection circuit as defined in claim 3, wherein the resistance values of said second parts of said first and second voltage divider are of a higher order of magnitude than those of said first parts of said first and second voltage divider.

11. The electronic power overload protection circuit as defined in claim 1, and further comprising means for limiting the output power to a different threshold with the output current being substantially constant with increasing output voltage; and threshold selection means for selecting between said decreasing and said constant thresholds.

12. The electronic power overload protection circuit as defined in claim 11, wherein said threshold selection means includes means for sensing the temperature of the amplifier, and means for preventing selection of said constant threshold when the amplifier temperature exceeds a predetermined maximum permissible value.

13. The electronic power overload protection circuit as defined in claim 12, wherein said threshold selection means includes means for selecting said decreasing slope thresholds once the amplifier temperature exceeds said predetermined maximum value.

14. The electronic power overload protection circuit as defined in claim 11 for use in a push-pull amplifier which includes a differential input stage having an output connected to an input of a buffer amplifier having an output that feeds a push-pull output stage of the amplifier, and further comprising coupling means from said sensing means to the input of said buffer amplifier for coupling two opposite potentials to said input of said buffer amplifier in dependence on the state of said sensing means for selectively supplying and drawing off current from said input of said buffer amplifier.

15. The electronic power overload protection circuit as defined in claim 14, wherein said output stage includes first and second push-pull input transistors having interconnected bases, means for supplying the output of a constant current source to said interconnected bases, and means for feeding the output of said buffer amplifier to said interconnected bases; and wherein said coupling means includes an output transistor associated with said sensing means and operative for coupling said opposite potentials to said input of said buffer amplifier directly or through a current mirror.

16. The electronic power overload protection circuit as defined in claim 14, and further comprising a compensating capacitance arranged between the input and the output of the buffer amplifier.

* * * * *